United States Patent
Stark et al.

[11] Patent Number: 5,973,399
[45] Date of Patent: Oct. 26, 1999

[54] TAMPER RESISTANT ATTACH MECHANISM BETWEEN PLASTIC COVER AND THERMAL PLATE ASSEMBLY FOR PROCESSOR CARTRIDGES

[75] Inventors: Michael Stark, Tempe; Michael Rutigliano, Chandler, both of Ariz.; Bill Lieska, Shelton; Peter A. Davison, Sumner, both of Wash.; James S. Webb, Portland, Oreg.

[73] Assignee: Intel Corporation, Santa Clara, Calif.

[21] Appl. No.: 09/024,492

[22] Filed: Feb. 17, 1998

[51] Int. Cl.⁶ .......................... H01L 23/12; H01L 23/02; H05K 7/00
[52] U.S. Cl. .......................... 257/731; 257/678; 361/820; 438/106; 438/110
[58] Field of Search .................... 257/731, 678; 361/600, 796, 820; 438/106, 110

[56] References Cited

U.S. PATENT DOCUMENTS 5,659,459  8/1997  Wakabayashi et al. ................. 361/753

*Primary Examiner*—Mahshid Saadat
*Assistant Examiner*—Jhihan B Clark
*Attorney, Agent, or Firm*—Blakely, Sokoloff, Taylor & Zafman LLP

[57] ABSTRACT

An electronic cartridge. The cartridge may include a first cover and a second cover that are adjacent to a substrate. One or more integrated circuit packages may be mounted to the substrate. The cartridge may include a pin that extends from the first cover and which has a barb that is embedded into the second cover. The embedded barb will damage the second cover if the cover is removed from the cartridge. The present invention thus prevents the removal and re-installation of the cover from the cartridge.

10 Claims, 2 Drawing Sheets

TAMPER RESISTANT ATTACH MECHANISM BETWEEN PLASTIC COVER AND THERMAL PLATE ASSEMBLY FOR PROCESSOR CARTRIDGES

BACKGROUND OF THE INVENTION

1. Field of the Invention

The present invention relates to an electronic cartridge that deters tampering with integrated circuits located within the cartridge.

2. Background of the Invention

Integrated circuits are typically assembled into packages that are mounted to a printed circuit board. The packages may be enclosed by a cover that is coupled to the board. The cover and board assembly can be shipped as a product to a system level manufacturer or an end user that plugs the board into a motherboard of a computer.

It has been found that some board assemblies are tampered with before being installed into a system such as computer. Such tampering may degrade or disable the operation of the board and/or system.

The cover is typically coupled to the board by a fastener such as a screw or a clip. Such fasteners are easy to detach and re-install so that one cannot readily determine whether there has been an unauthorized tampering of the board assembly. It would be desirable to provide a board assembly that would not allow the removal and re-installation of a cover.

SUMMARY OF THE INVENTION

One embodiment of the present invention is an electronic cartridge. The cartridge may include a first cover and a second cover that are adjacent to a substrate. One or more integrated circuit packages may be mounted to the substrate. The cartridge may include a pin that extends from the first cover and which has a barb that is embedded into the second cover.

DETAILED DESCRIPTION OF THE INVENTION

One embodiment of the present invention is an electronic cartridge. The cartridge may include a first cover and a second cover that are adjacent to a substrate. One or more integrated circuit packages may be mounted to the substrate. The cartridge may include a pin that extends from the first cover and which has a barb that is embedded into the second cover. The embedded barb will damage the second cover if the cover is removed from the cartridge. The present invention thus prevents the removal and re-installation of the second cover from the cartridge.

Figure 1:
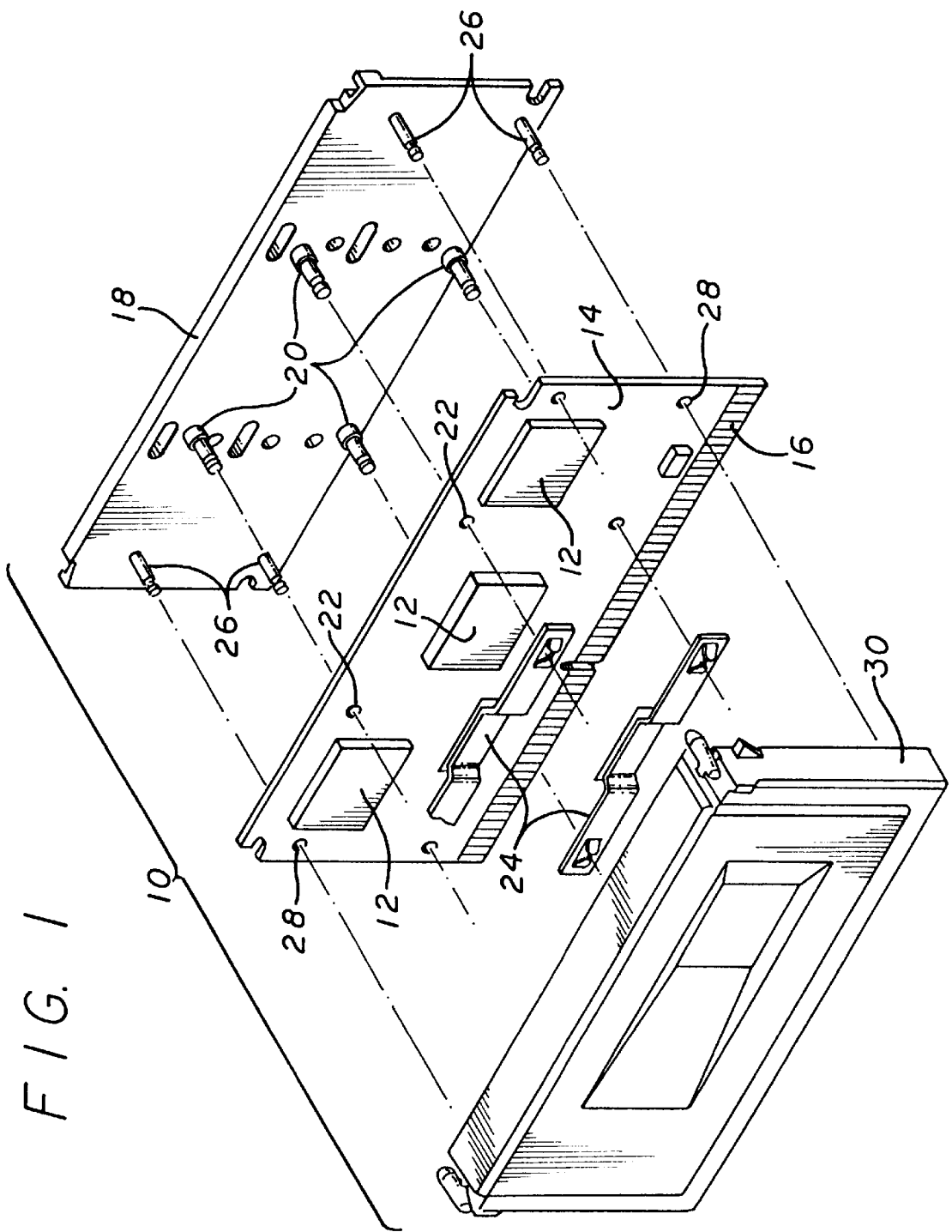
FIG. 1 is an exploded view of an electronic cartridge of the present invention.

Referring to the drawings more particularly by reference numbers, FIG. 1 shows an embodiment of an electronic cartridge 10 of the present invention. The cartridge may include one or more integrated circuit packages 12 that are mounted to a substrate 14. Each package 12 may contain one or more integrated circuits (not shown). The substrate 14 may be a printed circuit board which has surface pads, routing traces, power/ground planes, vias, etc. as is known in the art. One edge of the substrate 14 may have a plurality of conductive pads 16. The conductive pads 16 may be inserted into a card edge electrical connector (not shown) that is mounted to a motherboard (not shown).

The cartridge 10 may include a thermal element 18 that is thermally coupled to one or more integrated circuit packages 12. The thermal element 18 may be constructed from a thermally conductive material such as aluminum or copper. A heat sink (not shown) may be connected to the thermal element 18.

A plurality of first pins 20 may extend from the thermal element 18 through clearance holes 22 in the substrate 14. A pair of spring clips 24 may be attached to the pins 20 to couple the thermal element 18 to the substrate 14.

The cartridge 10 may also have a plurality of second pins 26 which extend from the thermal element 18 through clearance holes 28 of the substrate 14. The second pins 26 may be attached to a cover 30. The cover 30 may be constructed from a molded plastic material. The thermal element 18 and cover 30 may create a first cover and a second cover, respectively, that enclose the integrated circuit packages 12 of the cartridge 10.

Figure 2:
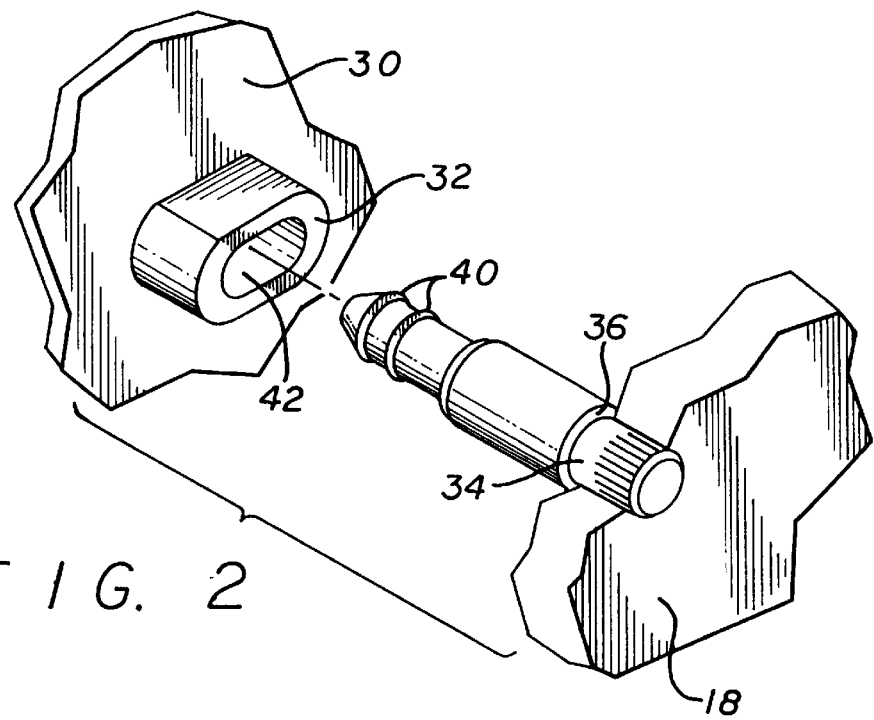
FIG. 2 is an exploded view showing a pin and a boss of a cover before cartridge.
Figure 3:
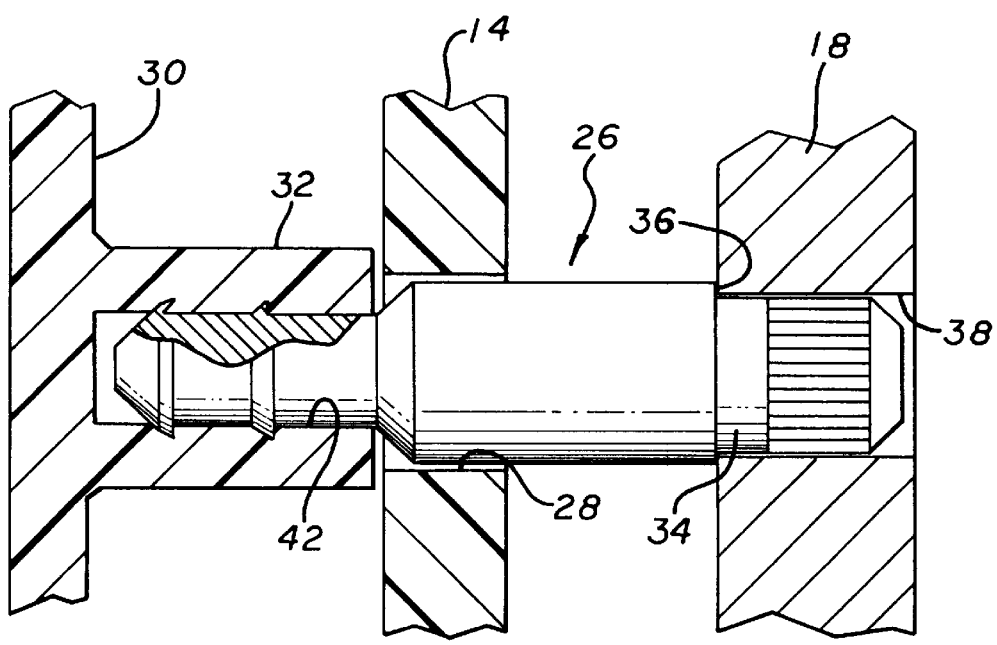
FIG. 3 is a cross-sectional view showing the pin inserted into the boss of the cover.

As shown in FIGS. 2 and 3, each second pin 26 is inserted into a corresponding boss 32 of the cover 30. Each second pin 26 may have a stud portion 34 that extends from a shoulder 36. The stud portion 34 is inserted into a corresponding hole of the thermal element 18. The shoulder 36 limits the insertion depth of the pin 26.

Each second pin 26 may also have one or more barbs 40 that are inserted into a corresponding opening 42 of each boss 32. The barbs 40 may have an unassembled cylindrical shape. Each opening 42 may have an oblong shape, wherein the minor diameter of the opening 42 is less than the diameter of the barbs 40.

As shown in Fig.3, when a second pin 26 is inserted into a boss 32, the oblong shaped openings 42 flatten the barbs 40 and embed the same into the cover 30. Once the barbs 40 are embedded into the cover 30 the pins 26 cannot be removed without damaging the bosses 32. Removal of the pins 26 will cause the barbs 40 to pull the bosses 32 away from the cover 30. The pins 26 cannot be reinserted into the bosses 32 after the cover 30 has been damaged. The present invention thus provides an cartridge that prevents the removal and reattachment of a cover. One can therefore identify whether there has been an unauthorized tampering with the cartridge 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic cartridge, comprising:
   a substrate;
   an integrated circuit package mounted to said substrate;
   a first cover located adjacent to said substrate;
   a second cover located adjacent to said substrate; and,
   a pin that extends from said first cover, said pin having a barb that is embedded into said second cover.

2. The cartridge as recited in claim 1, wherein said pin extends through said substrate.

3. The cartridge as recited in claim 1, wherein said first cover is a thermal element.

4. The cartridge as recited in claim 1, wherein said barb is embedded into a boss of said second cover.

5. The cartridge as recited in claim 4, wherein said boss has an oblong shape.

6. An electronic cartridge, comprising:

a substrate;

an integrated circuit package mounted to said substrate;

a thermal element attached to said substrate;

a cover that is located adjacent to said substrate;

a pin that extends from said thermal element and through said substrate, said pin having a barb that is embedded into said cover.

7. The cartridge as recited in claim 6, wherein said barb is embedded into a boss of said cover.

8. The cartridge as recited in claim 7, wherein said boss has an oblong shape.

9. A method for assembling an electronic cartridge, comprising:

a) placing a first cover adjacent to a substrate, wherein a pin with a barb extends from said first cover;

b) embedding said barb into a second cover.

10. The method as recited in claim 9, wherein said barb is deformed when embedded into said second cover.

* * * * *